(12) United States Patent
Yoon

(10) Patent No.: US 6,697,995 B1
(45) Date of Patent: Feb. 24, 2004

(54) DIAGNOSTIC METHOD FOR LOGIC USED IN VEHICLE

(75) Inventor: Hun-Joung Yoon, Suwon (KR)

(73) Assignee: Hyundai Motor Company, Seoul (KR)

( * ) Notice: Subject to any disclaimer, the term of this patent is extended or adjusted under 35 U.S.C. 154(b) by 413 days.

(21) Appl. No.: 09/667,595

(22) Filed: Sep. 22, 2000

(30) Foreign Application Priority Data

Dec. 14, 1999 (KR) .......................................... 1999-57413

(51) Int. Cl.[7] .............................................. G06F 11/00
(52) U.S. Cl. ........................... 714/799; 714/38; 714/40; 714/800; 708/533; 700/79
(58) Field of Search .......................... 714/799, 49, 800, 714/25, 38, 40; 444/1; 307/10.1; 712/208; 708/533; 700/79, 7

(56) References Cited

U.S. PATENT DOCUMENTS

| | | | | |
|---|---|---|---|---|
| 3,795,916 A | * | 3/1974 | Wallace et al. ................. | 444/1 |
| 4,314,350 A | * | 2/1982 | Toy .............................. | 708/533 |
| 4,326,291 A | * | 4/1982 | Marsh et al. ................ | 714/800 |
| 4,755,997 A | * | 7/1988 | Takahashi ..................... | 714/38 |
| 4,947,393 A | * | 8/1990 | Paul et al. .................... | 714/40 |
| 5,120,982 A | * | 6/1992 | Yopp et al. ................. | 307/10.1 |
| 5,980,081 A | * | 11/1999 | Watari et al. ................. | 700/79 |
| 6,151,689 A | * | 11/2000 | Garcia et al. ................. | 714/49 |

* cited by examiner

Primary Examiner—Albert Decady
Assistant Examiner—Dipakkumar Gandhi
(74) Attorney, Agent, or Firm—Birch, Stewart, Kolasch & Birch, LLP

(57) ABSTRACT

Disclosed is a diagnostic method for a logic used in a vehicle in which a sequence of a plurality of logic operations is predetermined, the method comprising the steps of assigning an ID to each logic operation; comparing an ID of a logic operation that should be performed ("correct logic operation") with an ID of a logic operation to be performed ("present logic operation") before the present logic operation is performed; and determining that an error has not occurred in the case where the correct logic operation corresponds to the present logic operation, and determining that an error has occurred in the case where the correct logic operation does not coincide with the present logic operation.

2 Claims, 3 Drawing Sheets

DIAGNOSTIC METHOD FOR LOGIC USED IN VEHICLE

BACKGROUND OF THE INVENTION (a) Field of the Invention

The present invention relates to a diagnostic method for a logic used in a vehicle, and more particularly, to a diagnostic method to check for errors in a logic of an electronic control unit of a vehicle.

(b) Description of the Related Art

Vehicles are increasingly employing electronic controls to enhance driving performance and safety, as well as to provide ease of operation to the driver. However, the computer system provided in vehicles may experience errors as a result of noise generated by static electricity and electrical shock. Errors caused by external electronic waves are particularly problematic.

In order to prevent errors caused by noise, a program in a logic of the computer system is reset in the prior art in the case where an error is generated in an operation code. However, if errors are not generated in the operation code, it is determined that the logic operations are being performed normally even when errors are generated as a result of noise in a sequence of the logic operations. This causes the faulty operation of the logic.

SUMMARY OF THE INVENTION

The present invention has been made in an effort to solve the above problems.

It is an object of the present invention to provide a diagnostic method for a logic used in a vehicle in which errors in a sequence of logic operations in an electronic control unit can be precisely detected.

To achieve the above object, the present invention provides a diagnostic method for a logic used in a vehicle in which a sequence of a plurality of logic operations is predetermined, the method comprising the steps of assigning an ID to each logic operation; comparing an ID of a logic operation that should be performed ("correct logic operation") with an ID of a logic operation to be performed ("present logic operation") before the present logic operation is performed; and determining that an error has not occurred in the case where the correct logic operation corresponds to the present logic operation, and determining that an error has occurred in the case where the correct logic operation does not coincide with the present logic operation.

According to a feature of the present invention, the diagnostic method further comprises the steps of counting a time elapsed to perform all the logic operations; calculating a difference between the time elapsed to perform all the logic operations and a predetermined time; and determining that an error has occurred if the difference in time is greater than a predetermined value.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

A diagnostic method for a logic according to the present invention is applied generally to an electronic control unit of a vehicle. A detailed description of the electronic control unit will not be provided herein as the operation and structure thereof are well known in the art to which the present invention pertains.

A program typically includes a plurality of logic operations. A sequence to which the logic operations in the program are performed depends on the task the program executes. In diagnostic methods for a logic according to first and second preferred embodiments of the present invention, a ID number is assigned to each logic operation to enable the logic operations to be distinguished from one another, and before a logic operation is executed, the ID of the logic operation previous to the logic operation to be performed is compared with the ID of the logic operation established in the sequence. In this way, it can be determined if there are any errors in the sequence.

Figure 1:
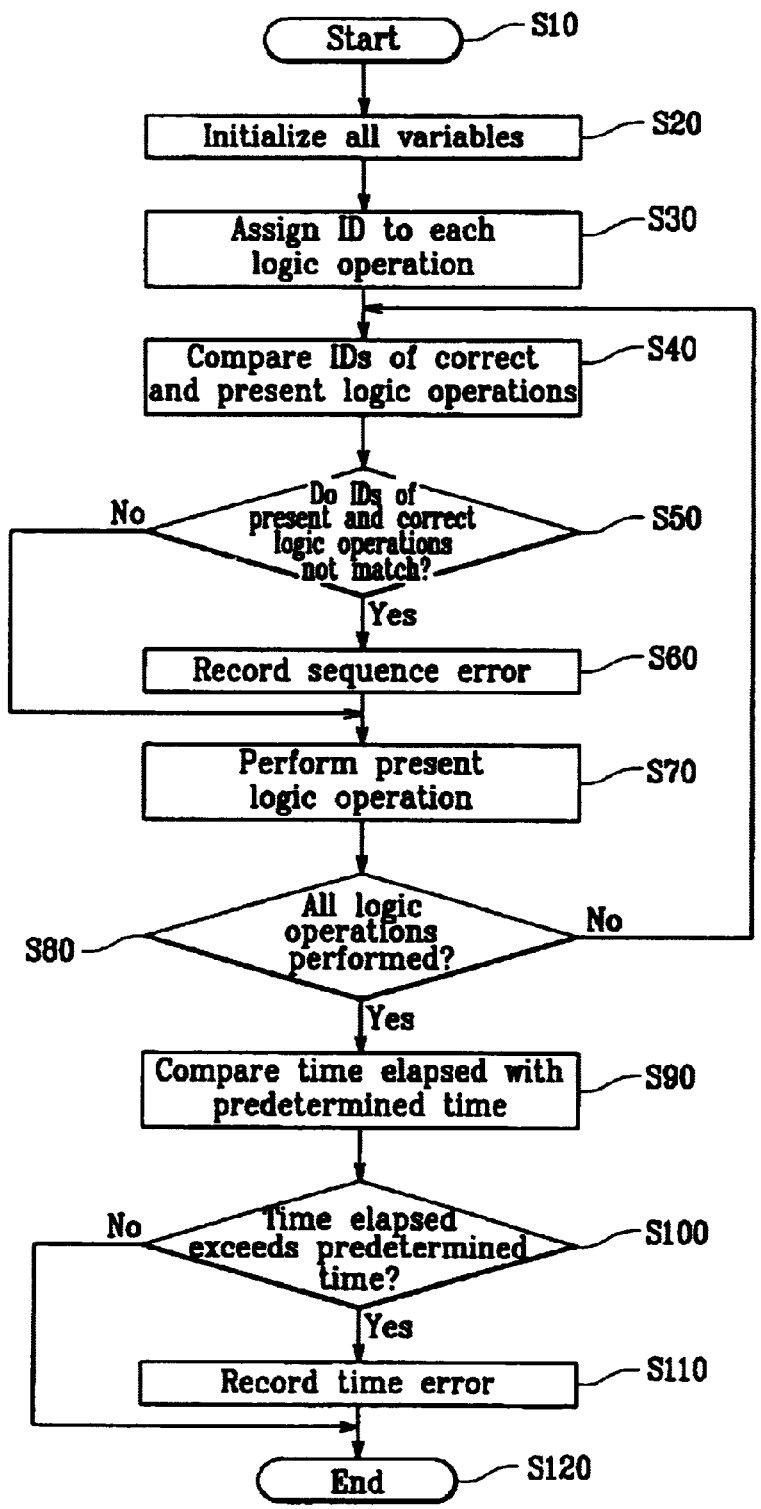
FIG. 1 is a flow chart of a diagnostic method for a logic used in a vehicle according to a first preferred embodiment of the present invention.

FIG. 1 shows a flow chart of a diagnostic method for a logic used in a vehicle according to a first preferred embodiment of the present invention.

When a program is made, the sequence to which the logic operations are performed is typically established within the program. It is to assumed that this is also the case with the program to which the present invention is applied.

If power is applied to an electronic control unit, the electronic control unit initializes all variables in step S20 then assigns an ID to each logic operation in step S30. Optionally, step S30 can be omitted and the IDs assigned when the program is made. As soon as initialization of step S20 is completed, the electronic control unit begins counting a time elapsed since the start of the program.

Next, the logic operations are performed according to a predetermined sequence. However, before running each logic operation, the ID of the logic operation previous to the logic operation to be performed at present (present logic operation) is determined, and the predetermined sequence is used to determine the logic operation that should be performed (correct logic operation), after which the IDs of the present logic operation and the correct logic operation are compared in step S40. Next, it is determined if the ID of the present logic operation coincides with the ID of the correct logic operation in step S50.

If the present logic operation does not coincide with the correct logic operation in step S50, it is determined that an error caused by noise, etc. has occurred, and a code signifying that an error has occurred in the sequence of the present logic operation is recorded in step S60, after which the present logic operation is performed in step S70. However, if the present logic operation corresponds to the correct logic operation in step S50, the present logic operation is directly performed in step S70.

Next, it is determined if all logic operations have been performed in step S80. If all the logic operations have not been performed, the process is returned to step S40. Accordingly, steps S40 through S70 are performed for each logic operation until all logic operations have been performed.

After all the logic operations have been performed, a time elapsed to perform all the logic operations is compared with a predetermined time to check for errors in step S90. Next, it is determined if the time elapsed to perform all the logic operations has exceeded the predetermined time in step S100. If the time elapsed to perform the logic operations has exceeded the predetermined time, it is determined that an error has occurred as a result of an error in the logic itself or in the sequence of the logic operations which would increase the time to perform the logic operations. That is, with the determination that an error has occurred, record of such an error (i.e., in the time to perform the logic operations) is made in step S110.

A diagnostic method for a logic in the specific case where five logic operations are performed by the logic will now be described.

Figure 2A:
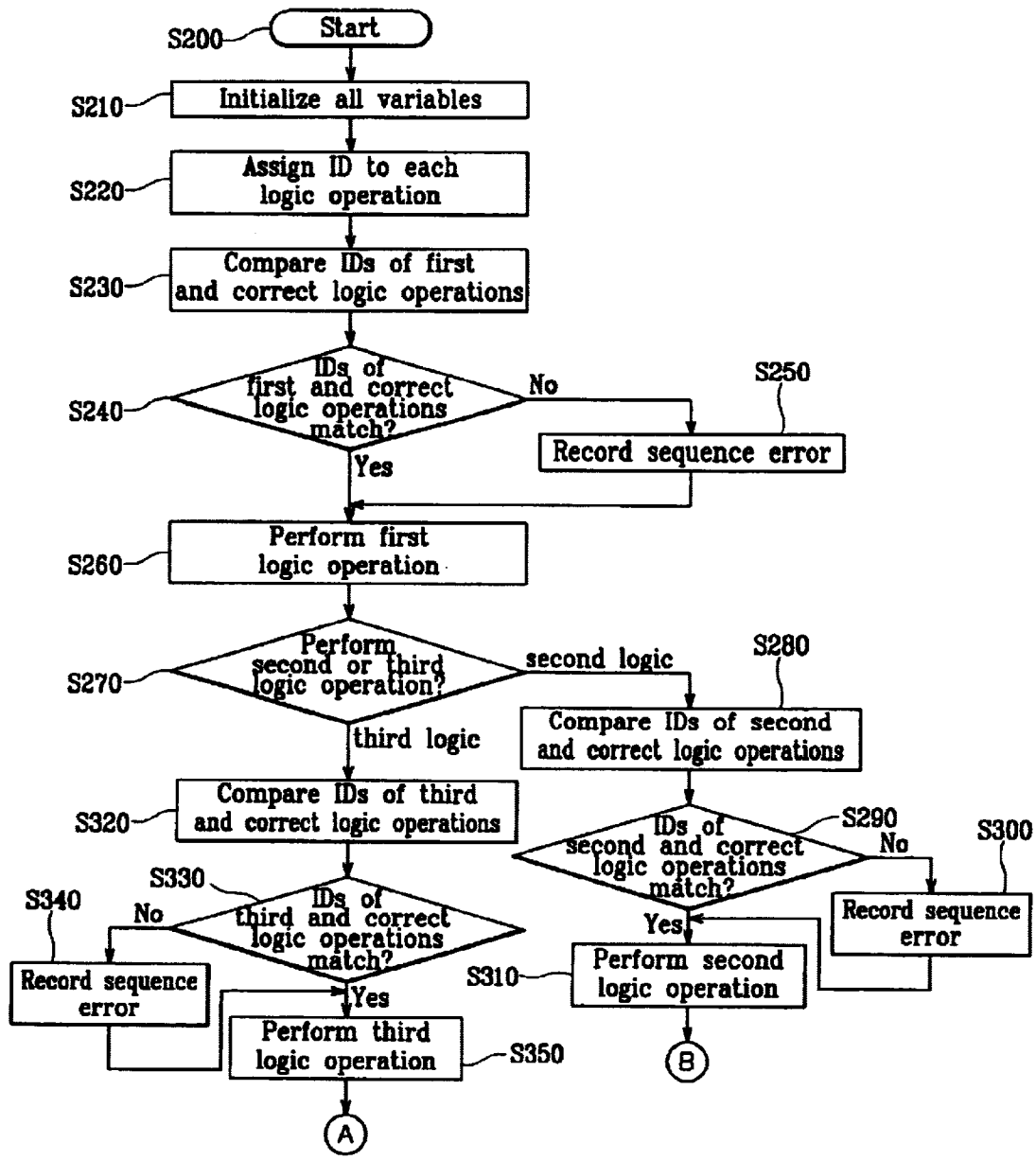
FIGS. 2a and 2b are flow charts of a diagnostic method for a logic used in a vehicle according to a second preferred embodiment of the present invention.
Figure 2B:
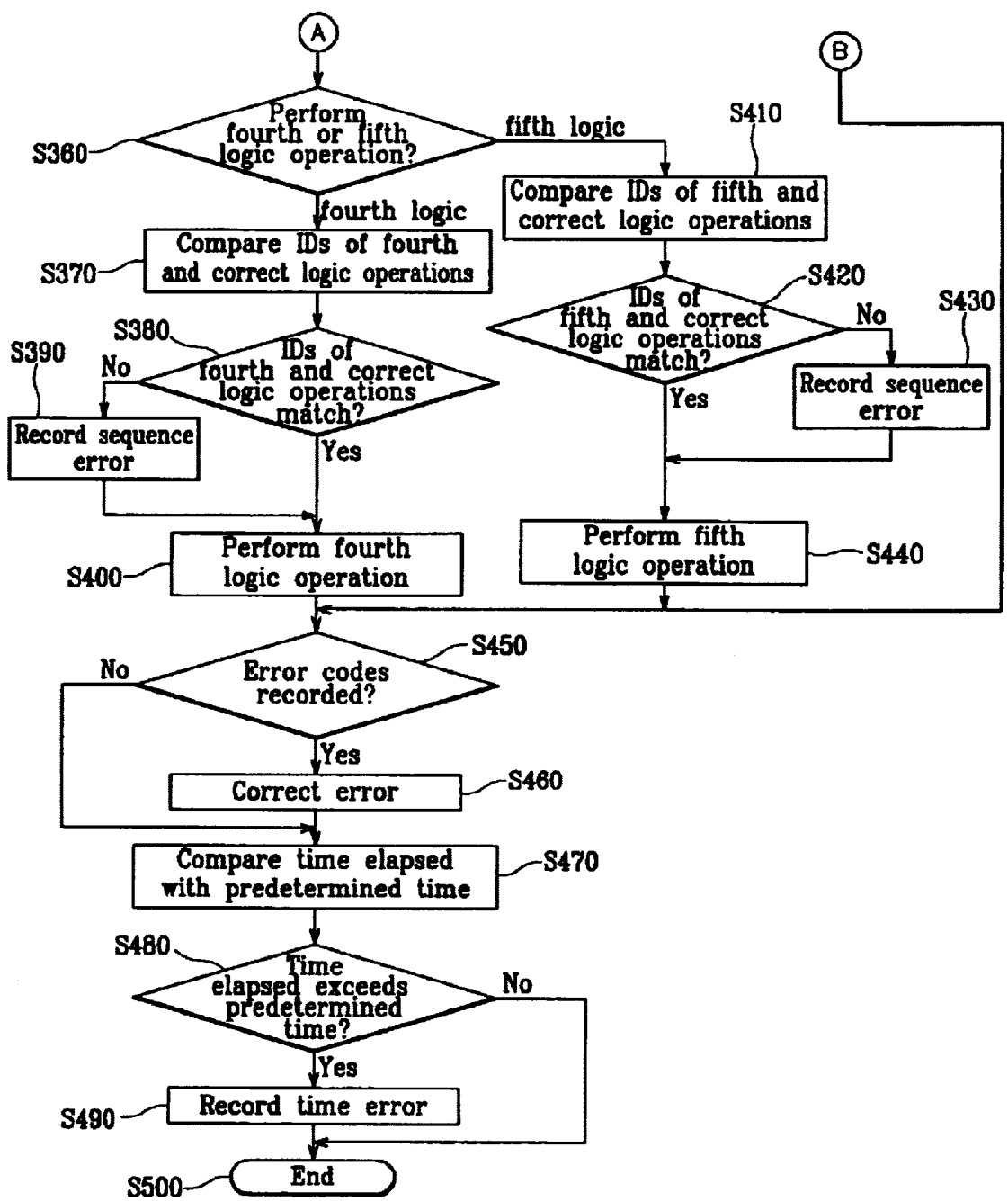

FIGS. 2a and 2b are flow charts of a diagnostic method for a logic used in a vehicle according to a second preferred embodiment of the present invention.

If power is applied to an electronic control unit, the electronic control unit initializes all variables in step S210 then assigns an ID to each logic operation in step S220. Optionally, step S220 can be omitted and the IDs assigned when the program is made. As soon as initialization of step S210 is completed, the electronic control unit begins counting a time elapsed since the start of the program.

Next, before running a first logic operation, an ID of a logic operation previous to the first logic operation is determined, and the predetermined sequence is used to determine the logic operation that should be performed (correct logic operation), after which the IDs of the first logic operation and the correct logic operation are compared in step S230. Next, it is determined if the ID of the first logic operation coincides with the ID of the correct logic operation in step S240.

In step S230, since there is no logic operation previous to the first logic operation, an ID such as "0" is used for the ID of the logic operation previous to the first logic operation. Also, in step S240, if the ID of the first logic operation does not coincide with the ID of the correct logic operation (resulting from a number other than "0" appearing as the ID of the logic operation previous to the first logic operation), a code signifying that an error has occurred is recorded in step S250. After the error code is recorded in step S250 or if the ID of the first logic operation coincides with the ID of the correct logic operation in step S240, the first logic operation is performed in step S260.

Subsequently, it is determined whether a second logic operation or a third logic operation needs to be performed in step S270. If the second logic operation needs to be performed, an ID of a logic operation previous to the second logic operation is determined, and the predetermined sequence is used to determine the correct logic operation, after which the IDs of the second logic operation and the correct logic operation are compared in step S280. Next, it is determined if the ID of the second logic operation coincides with the ID of the correct logic operation in step S290. If the ID of the second logic operation does not coincide with the ID of the correct logic operation, a code signifying that an error has occurred is recorded in step S300. After the error code is recorded in step S300 or if the ID of the second logic operation coincides with the ID of the correct logic operation in step S290, the second logic operation is performed in step S310.

If the third logic operation needs to be performed in step S270, an ID of a logic operation previous to the third logic operation is determined, and the predetermined sequence is used to determine the correct logic operation, after which the IDs of the third logic operation and the correct logic operation are compared in step S320. Next, it is determined if the ID of the third logic operation coincides with the ID of the correct logic operation in step S330. If the ID of the third logic operation does not coincide with the ID of the correct logic operation, a code signifying that an error has occurred is recorded in step S340. After the error code is recorded in step S340 or if the ID of the third logic operation coincides with the ID of the correct logic operation in step S330, the third logic operation is performed in step S350.

After the second or third logic operation is performed, it is determined whether a fourth logic operation or a fifth logic operation needs to be performed in step S360. If the fourth logic operation needs to be performed, an ID of a logic operation previous to the fourth logic operation is determined, and the predetermined sequence is used to determine the correct logic operation, after which the IDs of the fourth logic operation and the correct logic operation are compared in step S370. Next, it is determined if the ID of the fourth logic operation coincides with the ID of the correct logic operation in step S380. If the ID of the fourth logic operation does not coincide with the ID of the correct logic operation, a code signifying that an error has occurred is recorded in step S390. After the error code is recorded in step S390 or if the ID of the fourth logic operation coincides with the ID of the correct logic operation in step S380, the fourth logic operation is performed in step S400.

If the fifth logic operation needs to be performed in step S360, an ID of a logic operation previous to the fifth logic operation is determined, and the predetermined sequence is used to determine the correct logic operation, after which the IDs of the fifth logic operation and the correct logic operation are compared in step S410. Next, it is determined if the ID of the fifth logic operation coincides with the ID of the correct logic operation in step S420. If the ID of the fifth logic operation does not coincide with the ID of the correct logic operation, a code signifying that an error has occurred is recorded in step S430. After the error code is recorded in step S430 or if the ID of the fifth logic operation coincides with the ID of the correct logic operation in step S420, the fifth logic operation is performed in step S440.

After all the logic operations are performed as described above, it is determined if any error codes were recorded in step S450. If error codes were recorded, the error is corrected in step S460.

Next, a time elapsed to perform all the logic operations is compared with a predetermined time to check for errors in step S470. Next, it is determined if the time elapsed to perform all the logic operations has exceeded the predetermined time in step S480. If the time elapsed to perform the logic operations has exceeded the predetermined time, it is determined that an error has occurred as a result of an error in the logic itself or in the sequence of the logic operations which would increase the time to perform the logic operations. That is, with the determination that an error has occurred, record of such an error (i.e., in the time to perform the logic operations) is made in step S490.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A diagnostic method for a logic used in a vehicle in which a sequence of a plurality of logic operations is predetermined, the method comprising the steps of:

assigning an ID to each logic operation;

comparing an ID of a logic operation that should be performed ("correct logic operation") with an ID of a logic operation to be performed ("present logic operation") before the present logic operation is performed; and determining that an error has not occurred in the case where the correct logic operation corresponds to the present logic operation, and determining that an error has occurred in the case where the correct logic operation does not coincide with the present logic operation.

2. The diagnostic method of claim 1 further comprising the steps of:

counting a time elapsed to perform all the logic operations;

calculating a difference between the time elapsed to perform all the logic operations and a predetermined time; and determining that an error has occurred if the difference in time is greater than a predetermined value.

* * * * *